(12) United States Patent
Choy et al.

(10) Patent No.: US 9,621,149 B2
(45) Date of Patent: Apr. 11, 2017

(54) BOOTSTRAPPED SWITCH WITH A HIGHLY LINEARIZED RESISTANCE

(71) Applicant: Microchip Technology Inc., Chandler, AZ (US)

(72) Inventors: Benedict C. K. Choy, Cupertino, CA (US); James T. Walker, Palo Alto, CA (US); Ming-Yuan Yeh, Mountain View, CA (US)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 14/817,107

(22) Filed: Aug. 3, 2015

(65) Prior Publication Data

US 2015/0341024 A1 Nov. 26, 2015

Related U.S. Application Data

(62) Division of application No. 13/526,092, filed on Jun. 18, 2012, now Pat. No. 9,100,008.

(60) Provisional application No. 61/497,749, filed on Jun. 16, 2011.

(51) Int. Cl.
*H03K 17/16* (2006.01)
*H03K 17/06* (2006.01)

(52) U.S. Cl.
CPC ......... *H03K 17/063* (2013.01); *H03K 17/163* (2013.01)

(58) Field of Classification Search
CPC .......................... H03K 17/063; H03K 17/163
See application file for complete search history.

(56) References Cited

U.S. PATENT DOCUMENTS

| | | | |
|---|---|---|---|
| 4,500,801 A | 2/1985 | Janutka | |
| 5,006,736 A | 4/1991 | Davies | |
| 5,467,047 A | 11/1995 | Robb | |
| 5,828,244 A | 10/1998 | Palara et al. | |
| 5,963,078 A | 10/1999 | Wallace | |
| 6,344,768 B1 | 2/2002 | Daun-Lindberg et al. | |
| 7,596,009 B2 * | 9/2009 | Matsumoto | H02M 3/33592 363/127 |
| 8,829,842 B2 * | 9/2014 | Pangella | H03K 17/063 318/494 |
| 2010/0013541 A1 | 1/2010 | Balboni | |

* cited by examiner

*Primary Examiner* — Kenneth B Wells
(74) *Attorney, Agent, or Firm* — DLA Piper LLP (US)

(57) ABSTRACT

Systems and methods are disclosed for operating a highly linearized resistance for a switch through use of a bootstrapped features. In one exemplary implementation, there is provided a method and system that implements a method for operating a circuit configured to provide a highly linearized resistance including receiving a signal via a bootstrapped switch, coupling the received signal to a gate if the received signal is high, receiving a signal via a switch control input coupled to a high impedance element. Moreover, the method includes coupling the high impedance element to the gate and turning off the switch via a gate turn off when the gate turn off pulls the gate low.

2 Claims, 5 Drawing Sheets

BOOTSTRAPPED SWITCH WITH A HIGHLY LINEARIZED RESISTANCE

CROSS-REFERENCE TO RELATED APPLICATION INFORMATION

This application is a divisional application of U.S. patent application Ser. No. 13/526,092, filed on Jun. 18, 2012, and titled "Bootstrapped Switch with a Highly Linearized Resistance," issued on Aug. 4, 2015, as U.S. Pat. No. 9,100,008, which claims the benefit/priority of U.S. Provisional Patent Application No. 61/497,749, filed Jun. 16, 2011, both of which are incorporated herein by reference in their entirety.

BACKGROUND

Field

The present inventions relate to a system and method of utilizing a switch with a highly linearized resistance via bootstrapped features.

Description of Related Information

Switches such as Field Effect Transistor (FET) switches and Micro-Electro-Mechanical (MEM) switches are used in applications ranging from transmit/receive to Radio Frequency (RF) applications. One problem, is that when the input signals to the switch are near the power supply rails, the gate drive on the switches is reduced causing the resistance across the switch to increase. One solution to avoid this problem is to add a resistor in series with the gate of the switch so that when the input swings high, the gate also swings high from capacitive coupling, and the same gate drive is maintained as shown in patent US 2010/0013541-A1. However, the problem with this configuration is that during slow transients, the gate will not hold the bootstrapped voltage since there is a resistor connected. The voltage will quickly decrease to the original value as charge from the gate capacitance discharges through the resistor. In the case of a transmitter/receiver for transmit pulses of different durations, the resistance across the switch will change, and consequently the harmonic distortions will be affected. Hence, this topology does not work for transient signals with a long period. The innovations herein overcome this difficult and important issue. In particular, for high voltage transmit/receive switches used in ultrasound applications, it's especially difficult to have linearity because the input signals could be in the 100V to 200V range and it is difficult to maintain linearity over this range. Again the innovations herein invention can overcome this problem. Another problem with high voltage signals is that high voltage coupling back onto the gate could damage circuitry connected to that node. Here, the present innovations allow protection to limit the voltage at that node.

SUMMARY

Systems and methods consistent with the present invention relate to bootstrapped switches. In one exemplary implementation, there is provided circuitry comprising a switch, a control input signal to the switch, a high impedance element such as one or more diodes connected from the transistor to the control input signal, and an element or other means to turn off the gate of the switch.

It is to be understood that both the foregoing general description and the following detailed description are exemplary and explanatory only and are not restrictive of the invention, as described. Further features and/or variations may be provided in addition to those set forth herein. For example, the present invention may be directed to various combinations and subcombinations of the disclosed features and/or combinations and subcombinations of several further features disclosed below in the detailed description.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present innovations. Wherever possible, the same reference numbers will be used throughout the drawings to refer to the same or like parts.

Figure 1:
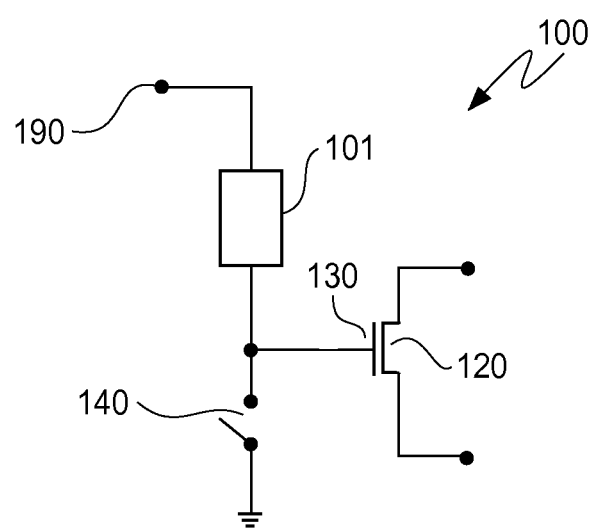
FIG. 1 depicts a bootstrapped switch consistent with certain aspects related to the innovations herein.

REFERENCE NUMERALS 101 high impedance element, circuitry or network
120 switch
130 gate of switch
140 gate turn off mechanism
150 clamping diode
190 switch control input FIG. 1 depicts the circuit 100 with bootstrapped switch consistent with certain aspects related to the innovations herein. In the illustrative implementation shown here, a high impedance element 101 connects from the switch control input 190 to the gate 130 of the switch 120. In some implementations, a gate turn off mechanism 140 may be connected between the gate 130 of the switch 120 and ground to turn off the switch 120. During operation, when the switch 120 is on and an input signal rises on input end of the switch 120, this signal would couple back onto the gate 130.

The circuit 100 is configured to provide a highly linearized resistance. The circuit includes a switch 120 having an input, output, and a gate 130 wherein the switch 120 is configured in a bootstrap configuration. The circuit also includes high impedance element 101 having a first and a second terminal, the first terminal coupled to the gate 130. Additionally, a gate turn off element 140 having a first terminal and a second terminal may be provided, wherein the first terminal is coupled to both the gate 130 and the first terminal of the high impedance element 101. The circuit 100 may also includes a switch control input 190 coupled to the second terminal of the high impedance element 101. Further, the switch 120 is configured to turn on and couple a signal back to the gate 130 through its output end when the signal rises on the input end when in use.

Another embodiment includes a method of operating the circuit 100 which is configured to provide a highly linearized resistance. In one exemplary implementation, such method may include receiving a signal via a bootstrapped switch 120, coupling the received signal to a gate 130 if the received signal is high, and receiving a signal via a switch control input 190 coupled to a high impedance element 101. Further implementations may include coupling the high impedance element 101 to the gate 130 and/or turning off the switch 120 via a gate turn off 140, wherein the gate turn off 140 pulls the gate 130 low.

According to aspects of these method of operation embodiments, the high impedance element 101 may be a diode. Further, the gate turnoff 140 may be a Field Effect Transistor or a bipolar transistor acting as a switch, where the gate turnoff 140 could have a drain to the gate 130 and source to ground.

Figure 2:
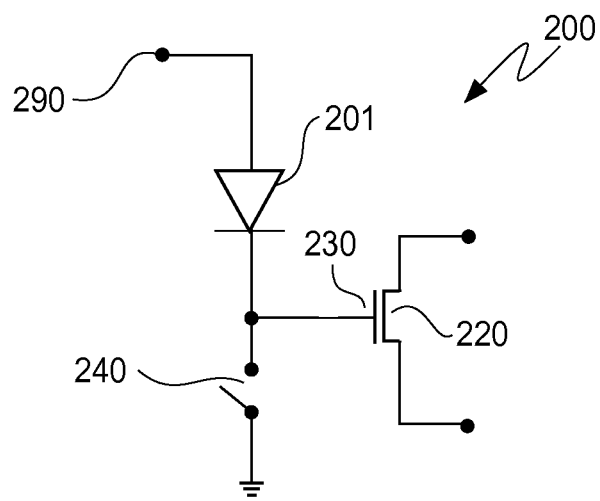
FIG. 2 depicts a bootstrapped switch consistent with certain aspects related to the innovations herein using a diode as the high impedance element.

FIG. 2 depicts the circuit 200 using a diode for the high impedance element consistent with certain aspects related to the innovations herein. According to various desired implementations, the high impedance element may be an element or circuit that exhibits very high impedance when the gate 230 is being coupled high during a transient, and exhibits low impedance when the switch control input swings high to turn on the switch 220. In some embodiments, the high impedance element may be a diode or diode chain. Here, for example, the anode of a bootstrapped diode 201 connects to the switch control input 290 and the cathode connects to the gate 230 of the switch. During operation, when the switch 220 is on and an input signal rises on input end of the switch 220, this signal would couple back onto the gate 230. At this time, the bootstrapped diode 201 would be reversed biased and could hold the gate voltage high for a very long time since the leakage through a diode is very small. When the switch needs to be turned off, the gate turn off mechanism 240 pulls the gate 230 low, turning off the switch 220. This gate turn off mechanism 240 could be a FET transistor or a bipolar transistor acting as a switch. For example, in FIG. 3, gate turn off mechanism 340 is shown as a Field Effect Transistor with its drain to gate 330 and the source to ground. In some implementations, this bootstrapped operation may be effected in that the element between the gate 330 and the switch control input 390 needs to exhibit high impedance or act to block the switch control from directly driving the gate 330 when the input end of the switch 320 couples back to its gate 330.

The circuit 200 of may also include a diode as the high impedance element 201. Further, the gate turnoff component 240 may be a Field Effect Transistor.

The circuit 200 may also have the gate turnoff component 240 consisting of or including a bipolar transistor acting as a switch. Thus, the gate turnoff 240 could have a drain connected to the gate 230 and source connected to ground.

Figure 3:
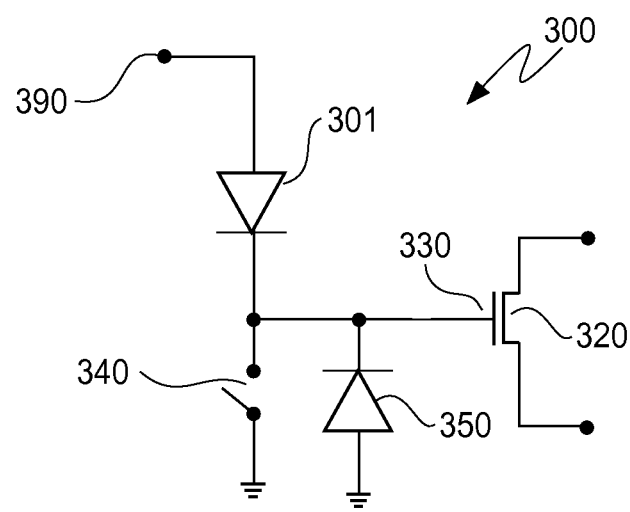
FIG. 3 depicts a bootstrapped switch consistent with certain aspects related to the innovations herein with an additional diode added to limit the voltage seen at the gate of the switch.

FIG. 3 depicts the circuit 300 the bootstrapped switch with an additional clamping diode 350 to limit the gate swing of the switch 320 consistent with certain aspects related to the innovations herein. If the input to the switch was a high voltage signal, the unwanted coupling of such high voltage signal back onto the gate 330 could damage the gate 330 or other circuitry connecting to that node. As such, a clamping diode 350 may be used to limit the voltage swing height on the gate 330. Another way to limit the voltage swing would be to adjust the breakdown of diode 301 to the desired voltage level.

Another embodiment may have the circuit 300 may include a clamping diode that is coupled to the gate 330 and configured to limit the gate swing of the switch 320. Also, in this configuration, the diode breakdown voltage could be configured at the desired level.

Referring to the method embodiment, a clamping diode 350 could be coupled with the gate 330 and configured to limit the gate swing of the switch 320. Further, in the method, the diode breakdown could be configurable in any number of ways as set forth herein.

Figure 4:
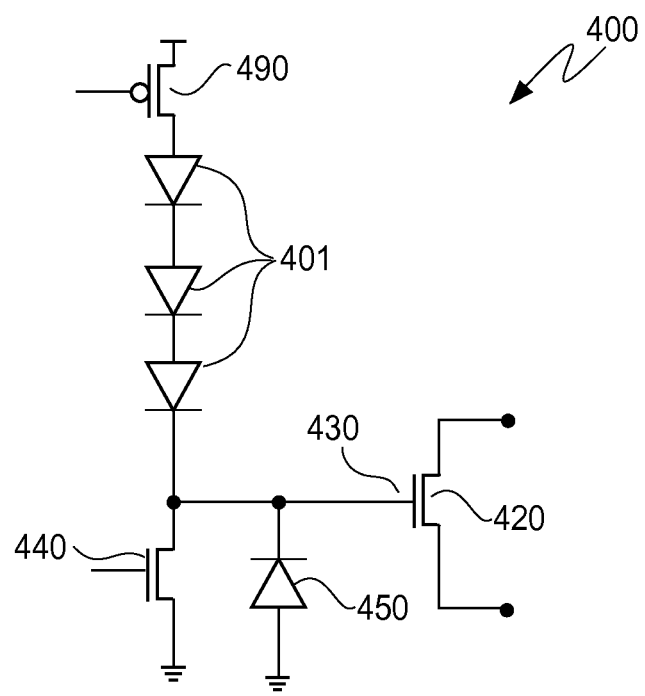
FIG. 4 depicts an alternative implementation of the bootstrapped switch consistent with certain aspects related to the innovations herein.

FIG. 4 depicts an alternative circuit 400 embodiment consistent with certain aspects related to the innovations herein. Here, a plurality of diodes 401 are placed in series with the switch control input 490. In the case where the breakdown voltage of the diode 401 is too low, multiple diodes can be placed in series such that the swing height of the gate voltage during the bootstrapped event would not be limited by the breakdown voltages of the diodes. Switch control input 490 has been replaced by a transistor 490, and the gate turn off mechanism has been replaced with a transistor 440. In some implementations, the quantity of diodes and/or their breakdown voltages may be set as large as possible, while setting the breakdown voltage of the clamping diode 450 to be as high as possible without damaging the gate, such that an extremely linear range for the switch 420 is achieved. This is especially important for high voltage input signals to the switch, such as signals from ultrasound transmitters which can often be in the 100V-200V range. In this case, if there was a 200V transmit signal on the switch, the same 200V transmit signal would couple back onto the gate of the switch, and effectively the gate to source drive on the switch would remain constant, and hence the linearity would remain constant over the entire input range.

Further, in one embodiment, the circuit 400 includes at least two diodes in series as the high impedance element 401. Still another embodiment has the gate turn off 440 as a transistor. This may also apply to the method or system embodiment.

Figure 5:
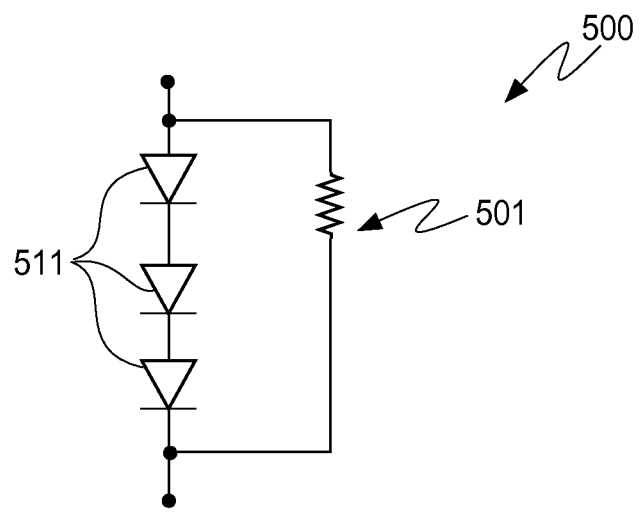
FIG. 5 depicts an alternative implementation of the high impedance element consistent with certain aspects related to the innovations herein.

FIG. 5 shows another circuit 500 embodiment of the high impedance element 501. In this case, multiple diodes 511 are in parallel with a large resistor.

Further, the circuit 500 wherein the high impedance element 501 includes three or more diodes in parallel with a resistor. This element could be placed back into the circuit of any of the above figures, in place of their respective high impedance element.

We claim:

1. A circuit that is configured to provide a highly linearized resistance, the circuit comprising:
    a switch having an input, output, and a gate wherein the switch is configured in a bootstrap configuration;
    a high impedance element having a first and a second terminal, the first terminal coupled to the gate, wherein the high impedance element includes at least two diodes in series, the diodes being in parallel with a resistor;
    a gate turn off element having a first terminal and a second terminal, the first terminal coupled to the gate and the first terminal of the high impedance element;
    a switch control input coupled to the second terminal of the high impedance element; and
    a clamping diode coupled to the gate and configured to limit the gate swing of the switch.

2. A circuit that is configured to provide a highly linearized resistance, the circuit comprising:

a switch having an input, output, and a gate wherein the switch is configured in a bootstrap configuration;
a high impedance element having a first and a second terminal, the first terminal coupled to the gate, wherein the high impedance element includes multiple diodes in parallel with a resistor;
a gate turn off element having a first terminal and a second terminal, the first terminal coupled to the gate and the first terminal of the high impedance element; and
a switch control input coupled to the second terminal of the high impedance element.

\* \* \* \* \*